(12) United States Patent
Shirai et al.

(10) Patent No.: US 6,600,308 B2
(45) Date of Patent: Jul. 29, 2003

(54) MAGNETIC ENCODER AND METHOD FOR REDUCING HARMONIC DISTORTION THEREOF

(75) Inventors: Masami Shirai, Saitama (JP); Masato Noguchi, Saitama (JP)

(73) Assignee: PENTAX Corporation, Tokyo (JP)

( * ) Notice: Subject to any disclaimer, the term of this patent is extended or adjusted under 35 U.S.C. 154(b) by 0 days.

(21) Appl. No.: 10/058,784

(22) Filed: Jan. 30, 2002

(65) Prior Publication Data

US 2002/0105445 A1 Aug. 8, 2002

(30) Foreign Application Priority Data

Feb. 5, 2001 (JP) .......................................... 2001-028185

(51) Int. Cl.⁷ .............................. G01B 7/30; G01R 35/00
(52) U.S. Cl. .......................... 324/207.12; 324/207.21; 324/225; 33/1 PT; 341/15
(58) Field of Search ..................... 324/207.12, 207.2, 324/207.21, 207.25, 225; 33/1 W, 1 PT, 281, 355 R, 356; 341/15; 702/106

(56) References Cited

U.S. PATENT DOCUMENTS

| | | | | |
|---|---|---|---|---|
| 5,581,488 A | * | 12/1996 | Seo ............................. 702/107 |
| 5,909,115 A | * | 6/1999 | Kano et al. ................ 324/207.21 |
| 6,259,249 B1 | * | 7/2001 | Miyata .................. 324/207.17 |
| 6,300,758 B1 | * | 10/2001 | Griffen et al. ......... 324/207.21 |
| 6,304,079 B1 | | 10/2001 | Kenjo et al. ........... 324/207.21 |
| 6,433,536 B1 | * | 8/2002 | Yundt et al. ........... 324/207.22 |

FOREIGN PATENT DOCUMENTS

JP    2001356016 A  * 12/2001  ........... G01C/15/00

* cited by examiner

*Primary Examiner*—Edward Lefkowitz
*Assistant Examiner*—Darrell Kinder
(74) *Attorney, Agent, or Firm*—Greenblum & Bernstein, P.L.C.

(57) ABSTRACT

A magnetic encoder includes a magnetic drum having, on the outer peripheral surface thereof, magnetized portions spaced at equal pitches; a magnetic sensor unit opposed to the outer peripheral surface of the magnetic drum; magnetic sensors are provided in the magnetic sensor unit spaced at a distance smaller than one pitch of the magnetized portions; a calculation device for calculating two sets of vectorial signals, from detection-signal output levels of the magnetic sensors generated upon rotation of the magnetic drum or the magnetic sensor unit, using the following equations (1) and (2):

$$A_{out} = \Sigma^{W}_{m=1} Vm \times \sin \theta m \quad (1); \text{ and}$$

$$B_{out} = \Sigma^{W}_{m=1} Vm \times \cos \theta m \quad (2);$$

wherein W designates the number of the magnetic sensors; Vm designates the detection-signal output levels of the magnetic sensors generated upon rotation of the magnetic drum or the magnetic sensor unit; $A_{out}$ and $B_{out}$ designates one and another set of vectorial signals.

10 Claims, 5 Drawing Sheets

Fig.1

B-Phase    A-Phase

MAGNETIC ENCODER AND METHOD FOR REDUCING HARMONIC DISTORTION THEREOF

BACKGROUND OF THE INVENTION

1. Field of the Invention

The present invention relates to a magnetic encoder in which harmonic distortion can be reduced and a harmonic distortion reducing method for the magnetic encoder.

2. Description of the Related Art

Utilizing a magnetic encoder as an angle measuring device is known in the art. Inventions in which a magnetic encoder is used as an angle measuring device for a conventional surveying instrument, such as a total station or a theodolite have been proposed. In general, a magnetic encoder includes a magnetic drum which rotates together with a collimating telescope and a magnetic sensor which detects the angular displacement of the magnetic drum. The magnetic drum is provided on its outer peripheral surface with a multipolar-magnetized layer having divided magnetized portions which are spaced at equal pitches corresponding to a dividing number N (N is a positive integer). The magnetic sensor is opposed to the multipolar-magnetized layer. The magnetic sensor is provided with, for example, four magnetic reluctance elements which are spaced at pitches smaller than the pitches of the divided magnetized portions. Therefore, the angular displacement of the magnetic drum is measured at the pitches of the magnetized portions by detecting the resistances of the magnetic reluctance elements which are varied in accordance with the rotation of the magnetic drum. The rotation angle of the magnetic drum between the pitches can be measured by interpolation.

However, in the case of a magnetic encoder, the dividing number of the magnetized portions of the multipolar-magnetized layer cannot be increased to that of an optical encoder, and furthermore, the pitch is large. Consequently, influence of distortion in one pitch (i.e., harmonic distortion) is large, due to dimensional error and deviation from the ideal magnetic reluctance curve of the magnetic reluctance elements.

SUMMARY OF THE INVENTION

The present invention provides a magnetic encoder, which can be suitably used in surveying, in which harmonic distortion of an arbitrary order is reduced, and also provides a harmonic distortion reducing method thereof.

In the specification, the phrase "reducing harmonic distortion" refers to the reduction of the influence of harmonic distortion, and/or the meaning thereof also includes the reduction of error caused by harmonic distortion.

For example, an embodiment includes a magnetic encoder including a magnetic drum which is provided on the outer peripheral surface thereof with a plurality of magnetized portions which are spaced at equal pitches; a magnetic sensor unit which is opposed to the outer peripheral surface of the magnetic drum, wherein one of the magnetic drum and the magnetic sensor constitute a rotational member, the rotational member being relatively rotatable with respect to the other of the magnetic drum and the magnetic sensor, wherein output detection signals from the magnetic sensor unit are cyclically varied in accordance with the relative rotation angle of the rotational member and the other of the magnetic drum and the magnetic sensor; a plurality of magnetic sensors which are provided in the magnetic sensor unit, wherein in order to correct harmonic distortion of an arbitrary order, the magnetic sensors are spaced at a distance smaller than one pitch of the magnetized portions, so that detection signals of each of the magnetic sensors are offset by a predetermined phase difference; a calculation device for calculating two sets of vectorial signals, from detection-signal output levels of the plurality of magnetic sensors generated upon rotation of the rotational member, using the following equations (1) and (2):

$$A_{out} = \Sigma^{W}_{m=1} Vm \times \sin\theta m \qquad (1); \text{ and}$$

$$B_{out} = \Sigma^{W}_{m=1} Vm \times \cos\theta m \qquad (2);$$

wherein W designates the number of the plurality of magnetic sensors; Vm designates the detection-signal output levels of the plurality of magnetic sensors generated upon rotation of the rotational member; $A_{out}$ designates a set of vectorial signals; and $B_{out}$ designates another set of vectorial signals. According to this construction, harmonic distortion of an arbitrary order can be reduced.

It is desirable for the calculation device to calculate a rotation angle of the rotational member by an interpolation calculation of the two sets of vectorial signals.

A method is provided for reducing harmonic distortion for a magnetic encoder, including a rotational member which is provided on the outer peripheral surface thereof with a plurality of magnetized portions which are spaced at equal pitches, and a plurality of magnetic sensors which are opposed to the outer peripheral surface of the rotational member, wherein output detection signals from the plurality of magnetic sensors are cyclically varied in accordance with the rotation angle of the rotational member. The method includes arranging the plurality of magnetic sensors so as to be spaced at a distance smaller than one pitch of the magnetized portions, so that detection signals of the respective magnetic reluctance elements are offset by a predetermined phase difference in order to correct harmonic distortion of an arbitrary order; and substituting output levels of the detection signals of the plurality of magnetic sensors, wherein the detection signals are detected when the rotational member rotates, into the following equations (1) and (2):

$$A_{out} = \Sigma^{W}_{m=1} Vm \times \sin\theta m \qquad (1); \text{ and}$$

$$B_{out} = \Sigma^{W}_{m=1} Vm \times \cos\theta m \qquad (2);$$

wherein W designates the number of the plurality of magnetic sensors; Vm designates the detection-signal output levels of the plurality of magnetic sensors generated upon rotation of the rotational member; $A_{out}$ designates a set of vectorial signals; and $B_{out}$ designates another set of vectorial signals.

A rotation angle of the rotational member can determined by an interpolation calculation of the two sets of vectorial signals.

The interpolation calculation can be performed using $\tan^{-1}(A_{out}/B_{out})$.

It is desirable for each of the plurality of magnetic sensors to be a magnetic reluctance element, wherein the magnetic reluctance elements are provided on a single substrate.

The output signals of the magnetic reluctance elements can be A/D-converted so as to produce digital signals, so that the interpolation calculation is carried out by the equations (1) and (2) on the digital signals.

The A–D converted digital signals can be corrected using a predetermined coefficient.

Alternatively, the output signals that have the same coefficient in the equations (1) and (2) can be added by an analog process, wherein the added output signals are thereafter A/D-converted.

The analog process can include an electrical connection of corresponding magnetic reluctance elements in series.

The present disclosure relates to subject matter contained in Japanese Patent Application No. 2001-28185 (filed on Feb. 5, 2001) which is expressly incorporated herein by reference in its entirety.

BRIEF DESCRIPTION OF THE DRAWINGS

Embodiments of the invention will be discussed below with reference to the accompanying drawings, in which:

FIG. 1 is a partially sectioned rear view of a total station having a magnetic encoder to which the present invention is applied, showing an internal structure of the magnetic encoder;

DESCRIPTION OF THE PREFERRED EMBODIMENTS

Figure 1:
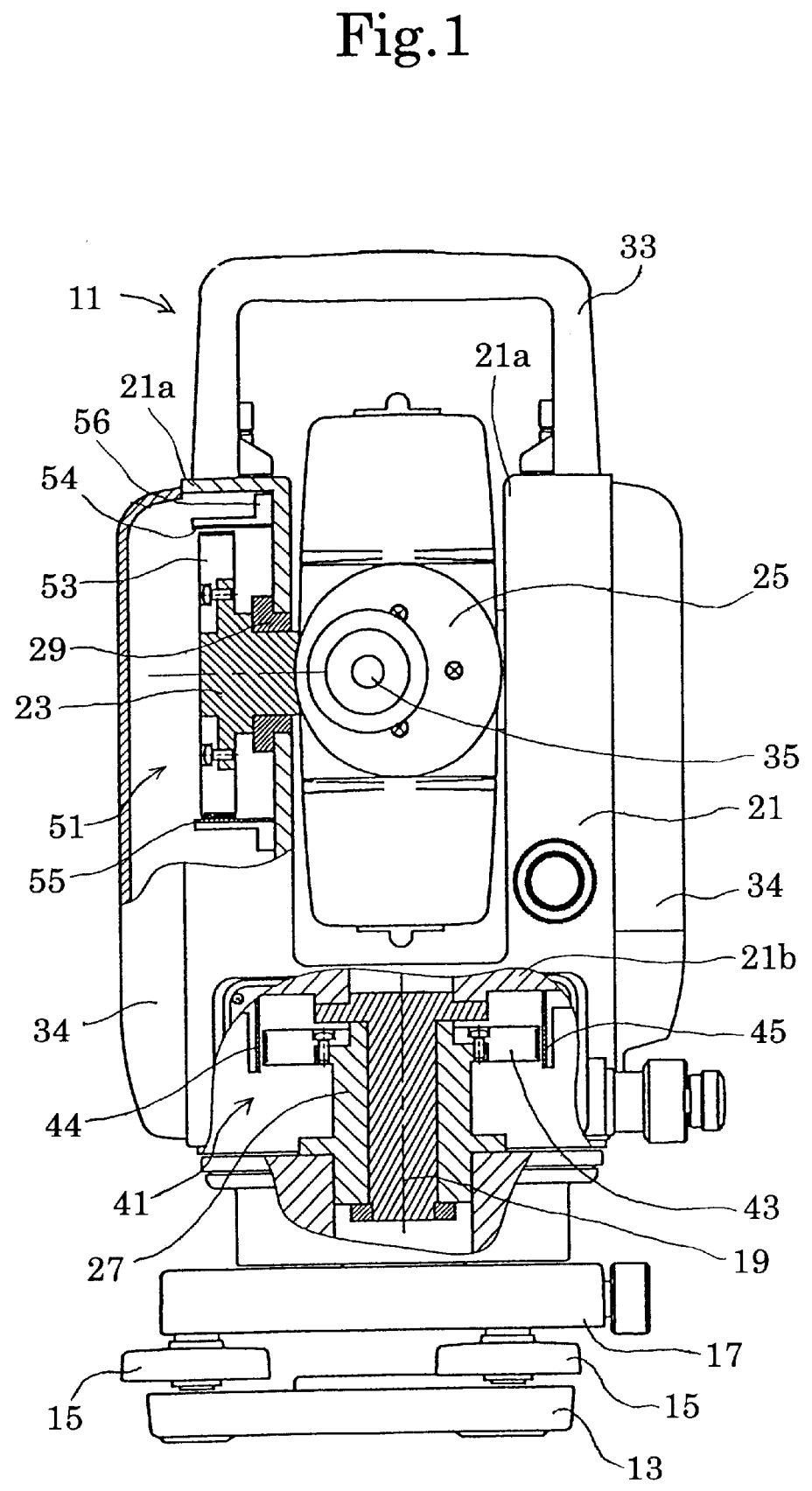
Figure 2:
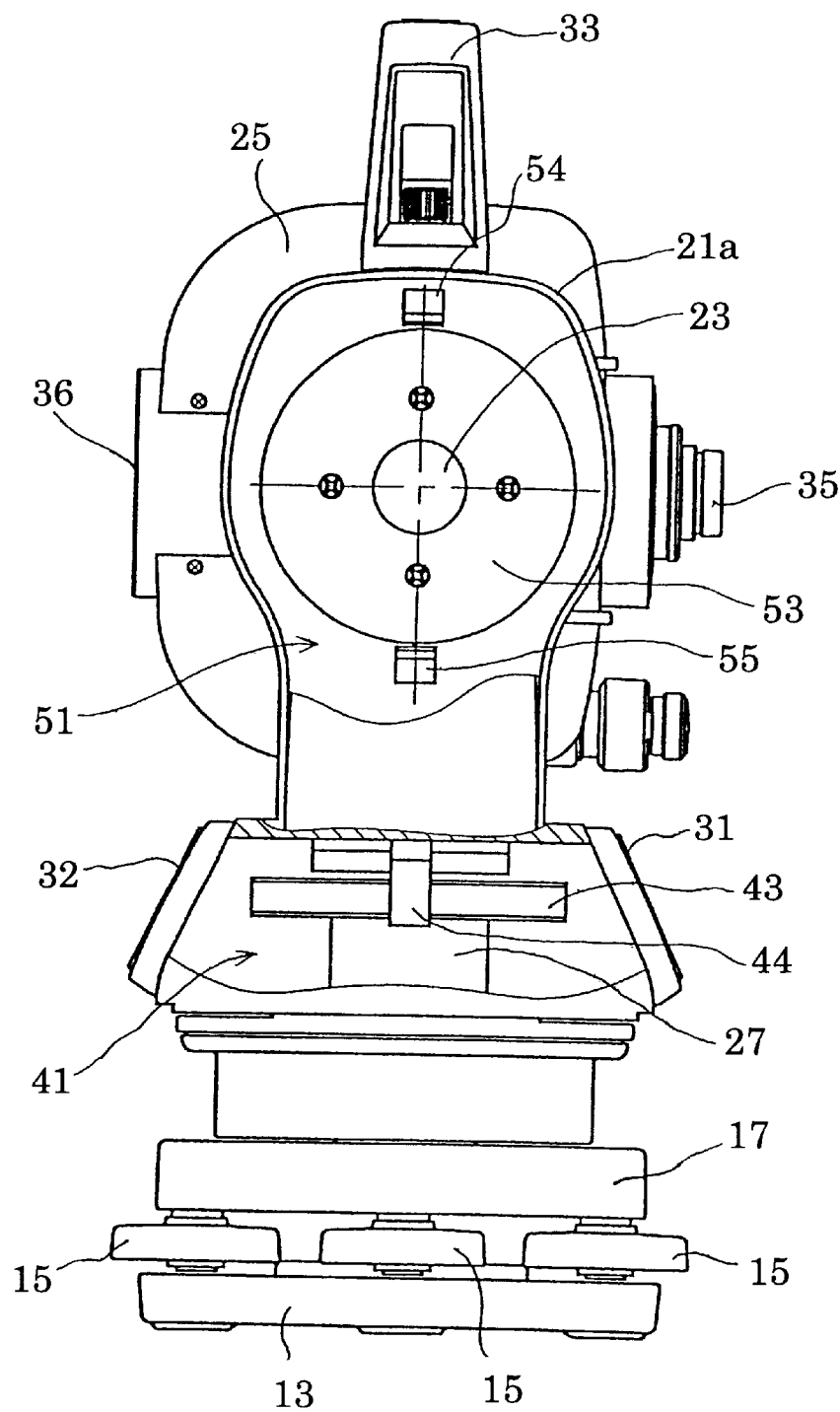
FIG. 2 is a partially broken side view of a total station shown in FIG. 1, showing an internal structure of the magnetic encoder.

FIG. 1 is a partially broken rear view of a total station 11 having magnetic encoders 41 and 51 in which an internal structure of each magnetic encoder 41 and 51 is shown. FIG. 2 is a partially broken side view of the total station 11 shown in FIG. 1 in which the internal structure of the magnetic encoder 41 is shown.

The total station 11 includes a base plate 13 which is used to mount the total station to a tripod or the like, a leveling board (head or base) 17 which is supported on the base plate 13 via three leveling screws 15, a U-shaped pedestal (body/stationary member) 21 which is provided with a pair of support columns 21a and which is rotatably supported on the leveling board 17 by a vertical shaft 19, and collimating telescope 25 which is rotatably supported by a pair of (coaxial) horizontal shafts 23 between the support columns 21a of the pedestal 21. The horizontal shafts 23 are secured to the right and left sides of the collimating telescope 25 and are rotatably supported by the support columns 21a of the pedestal 21. Note that only one horizontal shaft 23 is shown on the left side in FIG. 1.

The vertical shaft 19 is rotatably supported by a shaft bearing 27 secured to the leveling board 17. The pedestal 21 is provided with a base end 21b which connects the support columns 21a and which is secured to the upper end of the vertical shaft 19, so that the pedestal 21 is rotatable together with the vertical shaft 19. The horizontal shafts 23 are rotatably supported by bearings 29 secured to the support columns 21a of the pedestal 21. Thus, the collimating telescope 25 is supported by the pedestal 21 through the horizontal shafts 23 so as to rotate in the vertical direction and is supported by the leveling board 17 through the pedestal 21 and the vertical shaft 19 so as to rotate in the azimuth direction.

The magnetic encoder 41, provided as a horizontal angle measuring device, is attached to the shaft bearing 27 to measure the angular displacement (horizontal angle) of the vertical shaft 19 (pedestal 21/collimating telescope 25) relative to the leveling board 17 (shaft bearing 27). The magnetic encoder 51, provided as an altitude angle measuring device, is attached to the horizontal shaft 23 to measure the angular displacement (altitude angle) of the horizontal shaft 23 (collimating telescope 25). The magnetic encoders 41 and 51 are provided with magnetic drums (relatively rotational members) 43 and 53 secured to the shaft bearing 27 and the horizontal shaft 23. Magnetic sensor units 44 and 45 are provided closely opposed to, and spaced from, a multipolar-magnetized layer formed on the outer peripheral surface of the magnetic drum 43 at a predetermined distance, and are positioned at approximately 180 degree angular intervals (i.e., opposite to each other) with respect to the axis of the vertical shaft 19. Likewise, magnetic sensor units 54 and 55 are provided closely opposed to, and spaced from, the multipolar-magnetized layer from the on the outer peripheral surface of the magnetic drum 53 at a predetermined distance, and are positioned at approximately 180 degree angular intervals (i.e., opposite to each other) with respect to the axis of the horizontal shaft 23. In the present invention, the magnetic drums 43 and 53 are not limited to a specific shape, and can be in the form of a disk or a cylinder.

In this embodiment, in the magnetic encoder 41 the magnetic sensor units 44 and 45 rotate with respect to the magnetic drum 43, and in the magnetic encoder 51, the magnetic drum 53 rotates with respect to the magnetic sensor units 55 and 56.

An electronic circuit 61 (FIG. 4), details of which are not shown in the attached drawings, is provided in the base end 21b of the pedestal 21, and includes a signal processor and a calculating device for detecting the output signals of the magnetic sensor units 44, 45, 54 and 55, and for determining the angular displacement of the magnetic encoders 41 and 51, i.e., the horizontal angle and altitude angle. A keyboard (not shown) which is used to operate and control the total station 11, and operation panels 31 and 32 which are provided with displays, in which the basic data input through the keyboard or the measured distance data are indicated, are provided on the front and rear surfaces of the pedestal 21 (FIG. 2).

As shown in FIGS. 1 and 2, the total station 11 is provided with a hand grip 33 which can be held by an operator to carry the total station 11. FIG. 1 shows a dust cover 34 attached to the pedestal 21 to protect the magnetic encoder 41, batteries (not shown),and other internal components. The collimating telescope 25 is provided with an eyepiece 35 and objective lens 36.

Figure 3:
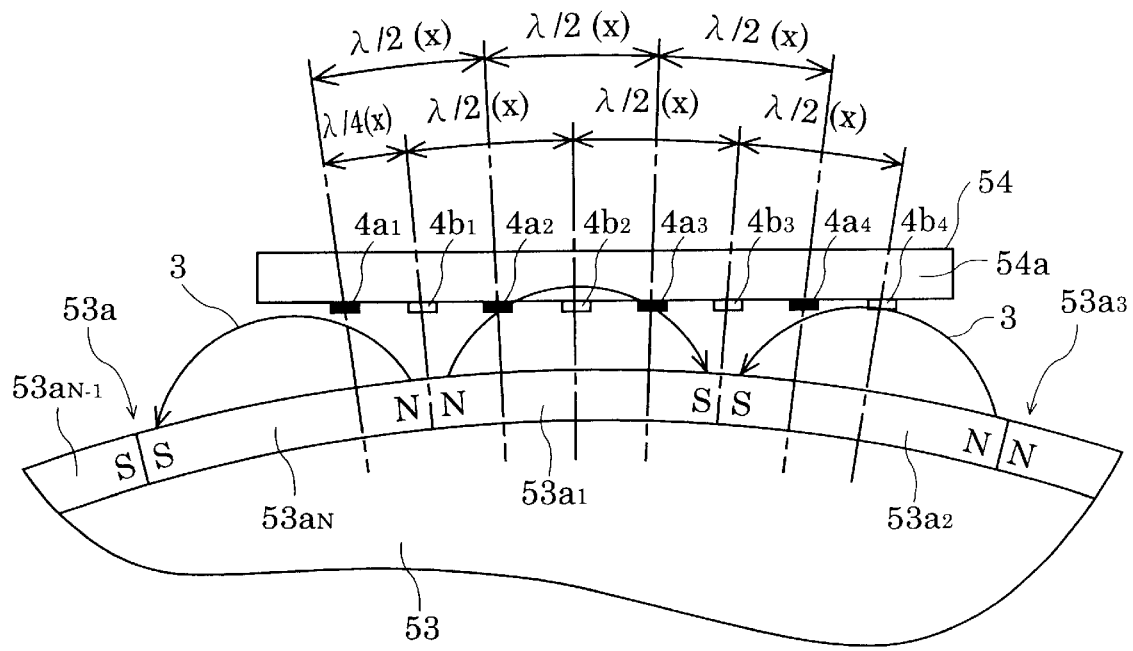
FIG. 3 is an enlarged view of a magnetic encoder showing a relationship between a magnetic drum and a magnetic sensor.
Figure 4:
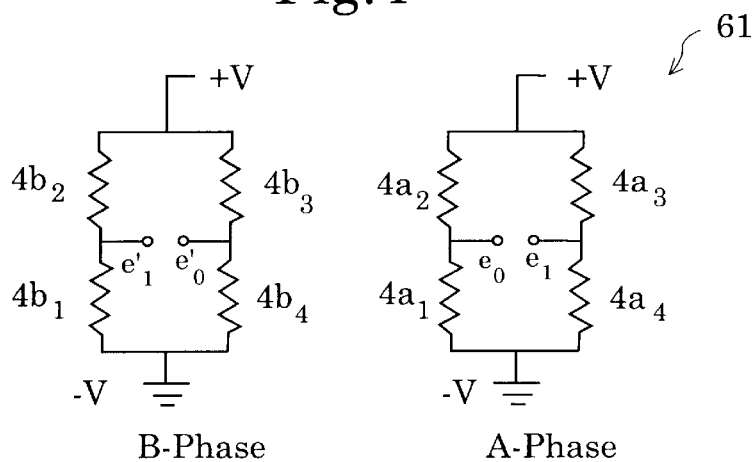
FIG. 4 is a circuit diagram showing connection between magnetic reluctance elements of a magnetic encoder shown in FIG. 1, by way of example.

The structures of the magnetic encoders 41 and 51 are identical, and hence, only the magnetic sensor unit 54 of the magnetic encoder 51 will be described with reference to FIGS. 3 and 4. FIG. 3 is an enlarged view showing a relationship between each magnetic reluctance element (magnetic sensor) $4a_1$ through $4b_4$ of the magnetic sensor unit 54 of the magnetic encoder 51 and the magnetized portions 53a of the multipolar-magnetized layer of the magnetic drum 53. FIG. 4 shows the electrical connection of the magnetic reluctance elements of the magnetic sensor unit 54. The magnetic sensor unit 54 is secured to an angled member 56 (see FIG. 1), and angled member 56 is secured to the pedestal 21.

The magnetic drum 53 is provided on its outer peripheral surface with the N-divided magnetized portions 53a which are spaced at equal pitches corresponding to a dividing number N (N is a positive integer). The pitch of the magnetic poles 53aN of the magnetized portions 53a (distance of the boundaries of the poles) is $\lambda$. The electrical angle of the pitch $\lambda$ is $2\pi$. The magnetic sensor unit 54 is opposed to and spaced from the magnetized portions 53a by a predetermined distance. The magnetic sensor unit 54 includes a single planar substrate 54a, and eight magnetic reluctance elements $4a_1$, $4b_1$, $4a_2$, $4b_2$, $4a_3$, $4b_3$, $4a_4$, $4b_4$, provided on the surface of the substrate opposed to the magnetized portions 53a and spaced at a distance of $\lambda/4$. The magnetic sensor unit 54 is arranged so that a normal line passing through the center thereof passes through the center of rotation of the magnetic drum 53.

The magnetic encoder 51 is an incremental magnetic encoder which detects a change in the resistance of the magnetic reluctance elements $4a_1$ through $4a_4$ and $4b_1$ through $4b_4$, depending on a change in the magnetic field 3 produced by the magnetized portions 53a when the magnetic drum 53 is rotated and detects the rotation angle $\omega$ of the magnetic drum 53 in accordance with the change of the resistance at $\lambda/4$ pitches. Note that the angles (fine rotation angles) between the $\lambda/4$ pitches can be obtained by interpolation.

The eight magnetic reluctance elements $4a_1$, $4b_1$, $4a_2$, $4b_2$, $4a_3$, $4b_3$, $4a_4$ and $4b_4$ are grouped into two groups, i.e., a A-phase consisting of the four magnetic reluctance elements $4a_1$ to $4a_4$ and a phase B consisting of the magnetic reluctance elements $4b_1$ to $4b_4$. The A-phase magnetic reluctance elements $4a_1$, $4a_2$, $4a_3$ and $4a_4$ and the B-phase magnetic reluctance elements $4b_1$, $4b_2$, $4b_3$ and $4b_4$ are alternately arranged. The distance of the A-phase magnetic reluctance elements $4a_1$ through $4a_4$ and the distance of the B-phase magnetic reluctance elements $4b_1$ through $4b_4$ is equivalent to $\lambda/2$, and the distance between the adjacent magnetic reluctance elements is $\lambda/4$.

The magnetic reluctance elements $4a_1$ to $4a_4$ and the magnetic reluctance elements $4b_1$ to $4b_4$ are bridge-connected, respectively. Namely, the magnetic reluctance elements $4a_1$ and $4a_2$ which are connected in series are connected in parallel with the magnetic reluctance elements $4a_3$ and $4a_4$ which are connected in series. Likewise, the magnetic reluctance elements $4b_1$ and $4b_2$ which are connected in series are connected in parallel with the magnetic reluctance elements $4b_3$ and $4b_4$ which are connected in series. A-phase terminals $e_0$ and $e_1$, and B-phase terminals $e_0'$ and $e_1'$ are connected to the lines between the magnetic reluctance elements that are connected in series, respectively. In an electronic circuit 61 thus formed, when a constant voltage V is applied between the magnetic reluctance elements that are bridge-connected, the change in the magnetic field is detected in accordance with a change in the voltage (phase) between the A-phase terminals $e_0$ and $e_1$ and between the B-phase terminals $e_0'$ and $e_1'$ to thereby detect the rotation angle $\omega$ of the magnetic drum 53. Namely, the number of changes of the phase is counted to detect the rotation angle $\omega$.

The resistances $a_1$, $a_2$, $a_3$ and $a_4$ of the A-phase magnetic reluctance elements $4a_1$ through $4a_4$ are cyclically varied in accordance with the change of the magnetic field 3 caused by the rotation of the magnetic drum, and are represented by the following formulae:

$a_1 = R_0 + R \sin(N\omega)$ $a_2 = R_0 + R \sin(N\omega + \pi) = R_0 - R \sin(N\omega)$ $a_3 = R_0 + R \sin(N\omega + 2\pi) = R_0 + R \sin(N\omega)$ $a_4 = R_0 + R \sin(N\omega + 3\pi) = R_0 - R \sin(N\omega)$ wherein $\omega$ represents the rotation angle of the magnetic drum 53, $R_0$ represents the resistance in the absence of the magnetic field, R represents the coefficient (resistance ratio), and N represents the number of the magnetized portions 53a (dividing number)

Therefore, when the outputs of the A-phase terminals $e_0$ and $e_1$ are differentially-amplified, the A-phase detection signal (vectorial signal) $A_{out}$ is given by:

$A_{out} = \alpha \times R \times V / R_0 \times \sin(N\omega)$;

wherein $\alpha$ represents the amplification rate.

Since the B-phase magnetic reluctance elements $4b_1$ through $4b_4$ are offset by $\lambda/4$ with respect to the A-phase magnetic reluctance elements $4a_1$ through $4a_4$, the B-phase detection signal $B_{out}$ is given by differentially-amplifing the outputs of the B-phase terminals $e_0'$ and $e_1'$ and is represented by:

$B_{out} = \alpha \times R \times V / R_0 \times \cos(N\omega)$.

The rotation angle of the magnetic drum 53 can be detected at units of 4×N (i.e., 360/(4×N) [degrees]) by detecting a zero-cross point of the A-phase and B-phase detection signals $A_{out}$ and $B_{out}$. Namely, the detection pitches can be reduced up to 4 times the number N of division, and thus the resolution can be improved. In a surveying instrument, the detection of the angle $\Delta\omega$ smaller than (1/N)/4 is needed. To this end, it is sometimes necessary to increase the dividing number more than N. It is possible to reduce the detectable detection pitch and increase the number of the detection pitches detect to thereby enhance the resolution by the interpolation shown below, without increasing the dividing number.

$\Delta\omega = \tan^{-1}(A_{out}/B_{out})$

Since the dividing number of the magnetized portions (53a) in the magnetic encoder (51) as discussed above cannot be greater than that of an optical encoder, and since the pitches in the magnetic encoder (51) are large, the harmonic distortion in one pitch is increased due to a dimensional error or a deviation of magnetic reluctance curves of the magnetic reluctance elements from an ideal curve. Consequently, it is very difficult to of increasing the precision. To meet this requirement, it is necessary to increase the number of the sensor units or the magnetic reluctance elements. For instance, it is necessary to provide two sets of identical sensors in order to correct an n-th order harmonic distortion, wherein the sensors are offset by an electrical angle of II/n. In this arrangement, it is necessary to provide 16 (=8×2) magnetic reluctance elements and, accordingly, $2^k$ magnetic reluctance elements must be used to correct k harmonic distortions. However, an increase in the number of the magnetic reluctance elements in one sensor unit increases the width of the sensor unit and, hence, the errors are increased due to the curvature of the magnetic drum, i.e., the distance difference between the magnetic drum and the magnetic reluctance elements.

In the embodiments of the present invention, to correct a predetermined harmonic distortion, W magnetic reluctance elements are arranged and spaced at an arbitrary phase difference (θm) within one pitch corresponding to a wavelength λ, i.e., an electric angle 2π, and a change Vm in the output relative to a change in the resistance of the W magnetic reluctance elements, caused in accordance with the rotation of the magnetic drum, is calculated as an A-phase detection signal $A_{out}$ and a B-phase detection signal $B_{out}$ by the following equations:

$$A_{out}=\Sigma^{W}_{m=1} Vm \times \sin \theta m \quad (1); \text{ and}$$

$$B_{out}=\Sigma^{W}_{m=1} Vm \times \cos \theta m \quad (2);$$

Thereafter, an interpolation calculation is carried out, based on the A-phase and B-phase detection signals $A_{out}$ and $B_{out}$ to obtain an angle (fine angle) Δω smaller than 2π/W pitches.

$$\Delta\omega = \tan^{-1}(A/B)$$

Figure 5:
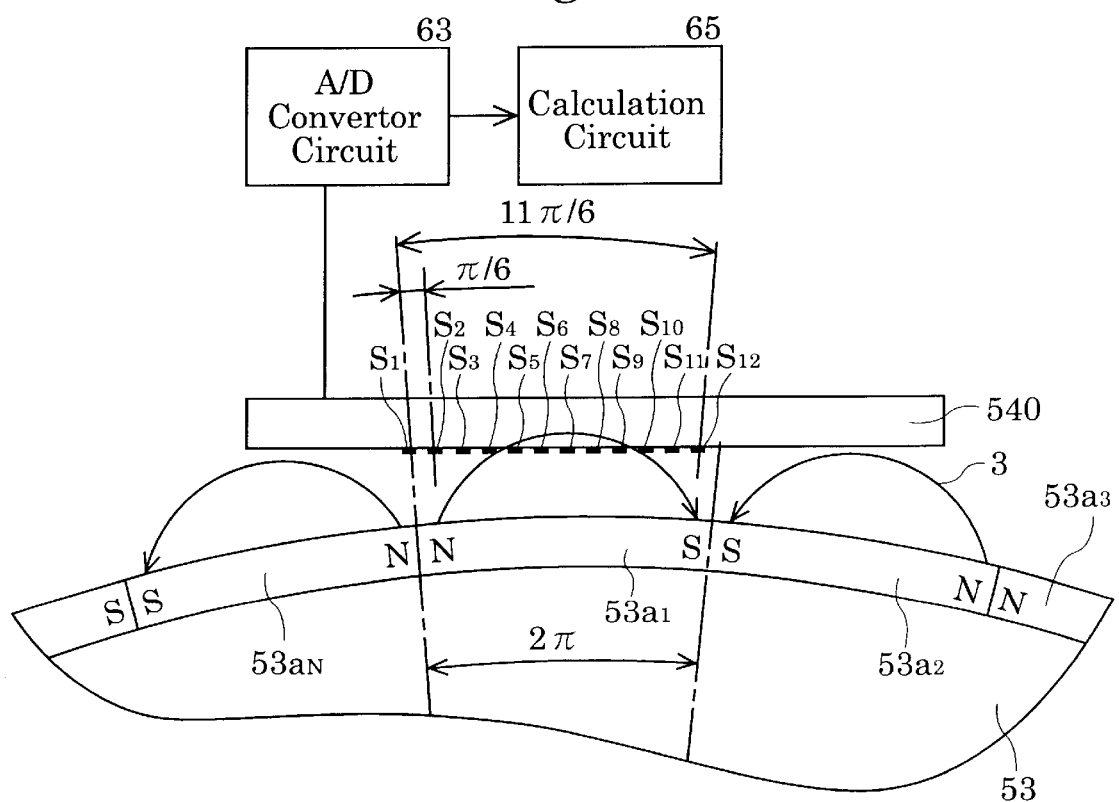
FIG. 5 is a schematic view of main components of a first embodiment of a magnetic encoder applied to a total station shown in FIGS. 1 and 2, according to the present invention.

Embodiments of the invention will be discussed below with reference to FIGS. 5, 6, 7 and 8. These embodiments are applied to a magnetic encoder for the total station 11 shown in FIGS. 1 and 2. FIGS. 5 and 7 correspond to FIG. 3. Note that in FIGS. 5 and 7, the components corresponding to those in FIGS. 1 and 2 are designated with like reference numerals.

Figure 6:
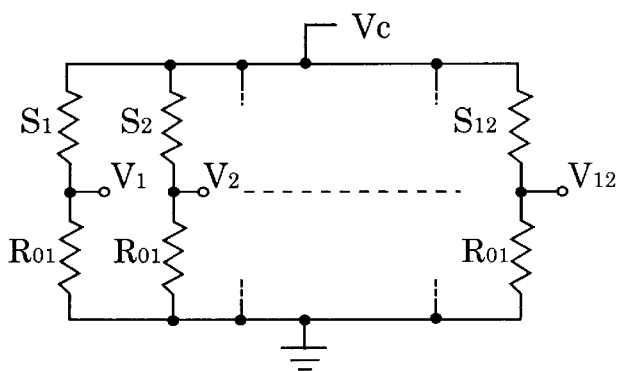
FIG. 6 is a schematic view of a first embodiment of a circuit diagram showing electrical connection between magnetic reluctance elements in a magnetic encoder shown in FIG. 5, according to the present invention.
Figure 7:
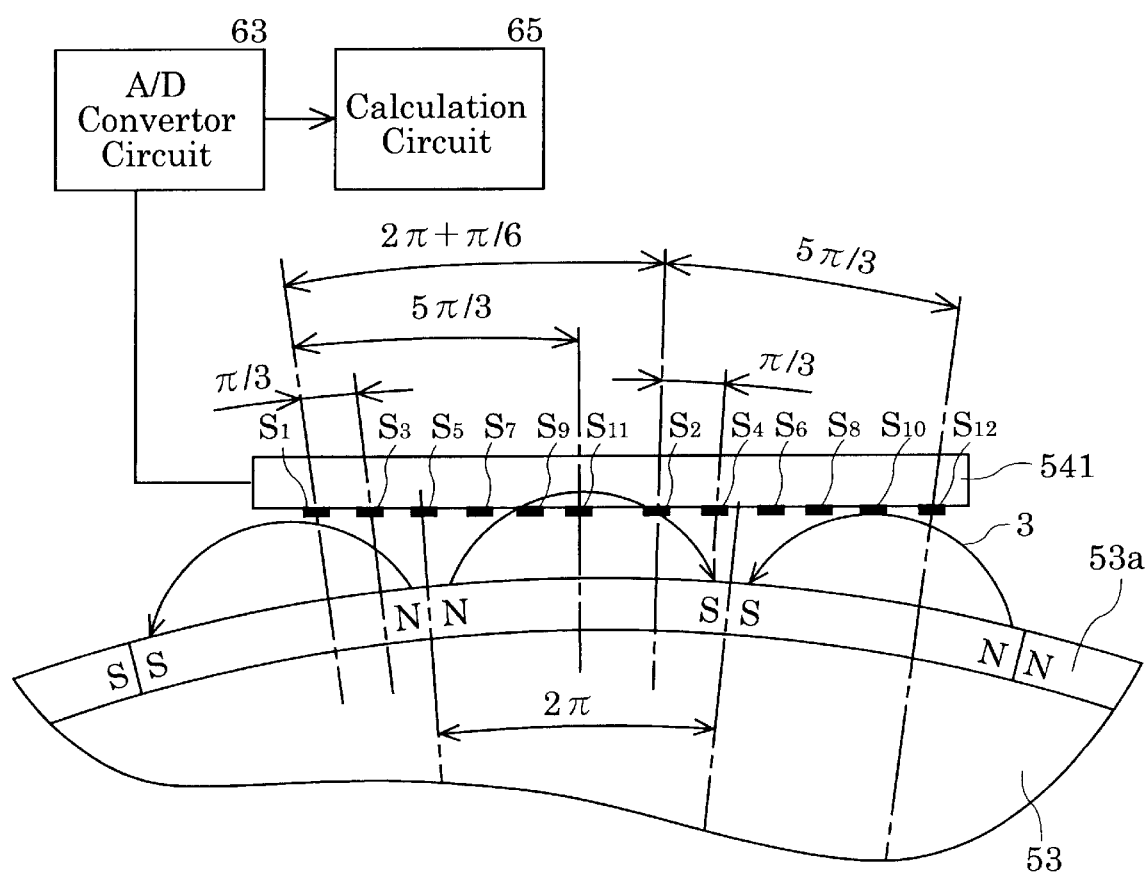
FIG. 7 is a schematic view of main parts of a second embodiment of a magnetic encoder applied to a total station shown in FIGS. 1 and 2, according to the present invention.

In a first embodiment shown in FIGS. 5 and 6, the magnetic reluctance elements are arranged to correct first-order, second-order and third-order harmonic distortion. A magnetic sensor unit 540 is provided with 12 magnetic reluctance elements $S_1$, $S_2$, $S_3$, $S_4$, $S_5$, $S_6$, $S_7$, $S_8$, $S_9$, $S_{10}$, $S_{11}$ and $S_{12}$. The magnetic reluctance elements $S_1$ through $S_{12}$ are arranged in the magnetic sensor unit 540, so that they have an equal phase difference of π/6, within one pitch (i.e., one pitch (an electrical angle of 2π, or one wavelength λ) of the magnetic poles 53aN of the magnetized portions 53a) of the N magnetized portions 53a having N magnetic poles on the outer peripheral surface of the magnetic drum. Namely, the distance between the adjacent magnetic reluctance elements $S_1$ through $S_{12}$ is π/6. Consequently, when the magnetic drum 53 is rotated, the magnetic field 3, to which each of the magnetic reluctance elements $S_1$ through $S_{12}$ is subjected, is changed (cyclically varied) by a phase difference of π/6. Therefore, the resistance value of the magnetic reluctance elements $S_1$ through $S_{12}$ is changed by a phase difference of π/6. The magnetic reluctance elements $S_1$ through $S_{12}$ are grounded through reference resistors $R_{01}$, and a reference voltage Vc is applied thereto (FIG. 6). Note that the reference resistors $R_{01}$ are denoted with the same designator to indicate the same resistance value.

The voltages at the connections between the magnetic reluctance elements $S_1$ through $S_{12}$ and the reference resistors $R_{01}$, as output levels, are converted to digital values $V_1$, $V_2$, $V_3$, $V_4$, $V_5$, $V_6$, $V_7$, $V_8$, $V_9$, $V_{10}$, $V_{11}$ and $V_{12}$, by an A/D converter 63. The arithmetic mean of the digital values is calculated by a calculation circuit (calculation device) 65 using the following equations (3) and (4) to obtain the A-phase and B-phase detection signals $A_{out}$ and $B_{out}$ and correct the first-order, second-order and third-order harmonic distortion.

$$A_{out}=\Sigma^{W}_{m=1} Vm \times \sin \theta m;$$

$$\sin \theta m = \sin(2\pi/W \times (m-1));$$

$$A_{out}=V_4-V_{10}+\frac{1}{2}(V_2+V_6-V_8-V_{12})+3^{-\frac{1}{2}}/2(V_3+V_5-V_9-V_{11}) \quad (3);$$

$$B_{out}=\Sigma^{W}_{m=1} Vm \times \cos \theta m;$$

$$\cos \theta m = \cos(2\pi/W \times (m-1));$$

$$B_{out}=-V_1-V_7+\frac{1}{2}(V_3+V_{11}-V_5-V_9)+3^{1/2}/2 (V_2+V_{12}-V_6-V_8) \quad (4);$$

wherein $V_1$ through $V_{12}$ are absolute values of a difference voltage from the reference voltage Vc.

A coarse rotation angle ω is obtained by counting the zero-cross points of the A-phase and B-phase detection signals $A_{out}$ and $B_{out}$ obtained by the above calculation.

The values of the A-phase and B-phase detection signals $A_{out}$ and $B_{out}$ are interpolated using the following equation to obtain an angle (fine angle) Δω smaller than ¼ pitch (phase difference of π/2).

$$\Delta\omega = \tan^{-1}(A_{out}/B_{out})$$

In the first embodiment, since the output levels of the magnetic reluctance elements $S_1$ through $S_{12}$ are converted to digital values by the A/D converter, not only can the magnetic filed difference due to the curvature of the magnetic drum 53 be corrected for each magnetic reluctance element, errors caused by an individual difference of the magnetic reluctance elements can also be corrected.

A second embodiment of a magnetic sensor unit according to the invention is shown in FIG. 7. In the second embodiment, the magnetic sensor unit 541 is provided with a plurality of magnetic reluctance elements which are not arranged within the electric angle 2π. In the second embodiment, 12 magnetic reluctance elements $S_1$ through $S_{12}$ are divided into an A-phase having six magnetic reluctance elements $S_1$, $S_3$, $S_5$, $S_7$, $S_9$, and $S_{11}$ and a B-phase having six magnetic reluctance elements $S_2$, $S_4$, $S_6$, $S_8$, $S_{10}$ and $S_{12}$. The electric angle between the magnetic reluctance elements in each phase is π/3, and the electric angle between the A-phase and the B-phase is 2π+π/6. The magnetic reluctance elements $S_1$ through $S_{12}$ are arranged within an electric angle of 4π. Namely, the pitches of the magnetic reluctance elements $S_1$, $S_2$, $S_3$, $S_4$, $S_5$, $S_6$, $S_7$, $S_8$, $S_9$, $S_{10}$, $S_{11}$ and $S_{12}$ are substantially π/6.

The magnetic reluctance elements $S_1$ through $S_{12}$ are connected in the same way as that in the first embodiment illustrated in FIG. 6. The outputs of the magnetic reluctance elements $S_1$ through $S_{12}$ are converted to digital values by the A/D converter 63, and the digital values are substituted in equations (5) and (6) by the calculation circuit (calculation device) 65 to calculate A-phase and B-phase detection signals $A_{out}$ and $B_{out}$. Consequently, the rotation angle is obtained by an interpolation calculation, based on the A-phase and B-phase detection signals $A_{out}$ and $B_{out}$.

Figure 8:
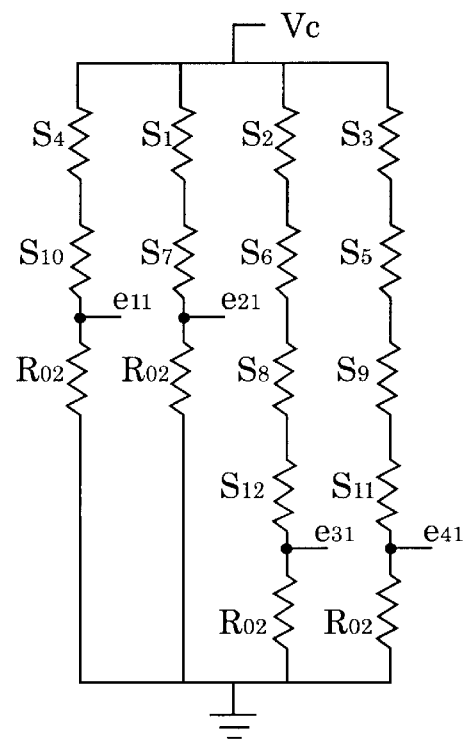
FIG. 8 is a schematic view of a second embodiment of a circuit diagram showing electrical connection between magnetic reluctance elements in a magnetic encoder shown in FIGS. 5 and 7, according to the present invention.

In the first embodiment illustrated in FIG. 6, the output signals of the magnetic reluctance elements $S_1$ through $S_{12}$ are used upon being A/D converted. However, in the second embodiment, it is possible to reduce the number of outputs and the amount of A/D conversion by analogously adding the outputs of the magnetic reluctance elements whose outputs have the same coefficient, i.e., by connecting the magnetic reluctance elements whose outputs have the same coefficient in series. The outputs of the magnetic reluctance elements whose outputs have the same coefficient are analogously added are shown in FIG. 8 with respect to equations (5) and (6), by way of example.

In the second embodiment of the electrical connection of the magnetic reluctance elements $S_1$ through $S_{12}$, the magnetic reluctance elements $S_4$ and $S_{10}$ are connected in series to a reference resistor $R_{02}$; the magnetic reluctance elements $S_1$ and $S_7$ are connected in series to a reference resistor $R_{02}$; the magnetic reluctance elements $S_2$, $S_6$, $S_8$ and $S_{12}$ are connected in series to a reference resistor $R_{02}$; and the magnetic reluctance elements $S_3$, $S_5$, $S_9$ and $S_{11}$ are connected in series to a reference resistor $R_{02}$. Note that the reference resistors $R_{02}$ are denoted with the same designator to indicate the same resistance value.

The magnetic reluctance elements $S_1$ through $S_{12}$ and the reference resistors $R_{02}$ connected in series thereto are inserted in parallel between the constant voltage (Vc) terminal and the ground. The output levels (voltages) at the connections between the reference resistors $R_{02}$ and the magnetic reluctance elements $S_{10}$, $S_7$, $S_{12}$ and $S_{11}$ are taken as outputs $e_{11}$, $e_{21}$, $e_{31}$, and $e_{41}$, and are converted to digital values by the A/D converter 63.

The digital values $e_{11}$, $e_{21}$, $e_{31}$ and $e_{41}$ are substituted in to equations (5) and (6), corresponding to equations (1) and (2), to obtain A-phase and B-phase detection signals $A_{out}$ and $B_{out}$:

$$A_{out} = e_{11} + \tfrac{1}{2}(e_{31}) + 3^{-1/2}/2(e_{41}) \qquad (5)$$

$$B_{out} = -e_{21} + \tfrac{1}{2}(e_{41}) + 3^{1/2}/2(e_{31}) \qquad (6)$$

An angle (fine rotation angle) $\Delta\omega$ which is smaller than $\pi/6$ by the detection of the zero-cross points of the magnetic reluctance elements is obtained by interpolation, using the following equation:

$$\Delta\omega = \tan^{-1}(A_{out}/B_{out})$$

As can be understood from the above discussion, according to the present invention, the 12 magnetic reluctance elements $S_1$ through $S_{12}$ corresponding to the first-order, second-order and third-order errors to be corrected are spaced at a phase difference $\theta$ identical to 1/(the number of orders×2) of the electric angle $\pi$, and the output levels (Vm) of the magnetic reluctance elements $S_1$ through $S_{12}$ are calculated using the equations (1) and (2) to obtain the two sets of A-phase and B-phase detection signals $A_{out}$ and $B_{out}$ having a vectorial phase difference. Thereafter, the A-phase and B-phase detection signals $A_{out}$ and $B_{out}$ are interpolated using an interpolation equation to obtain the rotation angle of the magnetic drum 53. Therefore, it is possible to correct a number of high-order harmonic distortion without increasing the number of the magnetic reluctance elements. Moreover, since the output signals of the magnetic reluctance elements $S_1$ through $S_{12}$ are A/D-converted, error due to irregularity of the curvature of the magnetic drum 53, etc., can be quantitatively corrected easily. Furthermore, since it is not necessary to provide a plurality of sensor units, the positioning operation of the sensor unit does not require a long time, and human error such as failure of adjustment does not occur.

Note that in the second embodiment, the 12 magnetic reluctance elements $S_1$ through $S_{12}$ are arranged within an electric angle of $2\pi$ at a phase difference of $\pi/6$ of one pitch of the magnetized portions 53a, however, the number of the magnetic reluctance elements and the phase difference are not limited thereto.

As can be seen from the foregoing, according to the present invention, to correct harmonic distortion of an arbitrary order, W magnetic reluctance elements are arranged and spaced at a distance shorter than one pitch of the magnetized portions so that the detection signals of the respective magnetic reluctance elements have a phase difference $\theta m$, and the output levels (Vm) of the W magnetic reluctance elements are calculated using the equations (1) and (2) to obtain two sets of A-phase and B-phase detection signals $A_{out}$ and $B_{out}$. Thereafter, the A-phase and B-phase detection signals $A_{out}$ and $B_{out}$ are interpolated using an interpolation equation to obtain the rotation angle of the rotary portion. Consequently, it is possible to correct a number of harmonic distortion without increasing the number of the magnetic reluctance elements.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A magnetic encoder comprising:
   a magnetic drum which is provided on the outer peripheral surface thereof with a plurality of magnetized portions which are spaced at equal pitches;
   a magnetic sensor unit which is opposed to the outer peripheral surface of the magnetic drum, wherein one of said magnetic drum and said magnetic sensor constitute a rotational member, said rotational member being relatively rotatable with respect to the other of said magnetic drum and said magnetic sensor, wherein output detection signals from said magnetic sensor unit are cyclically varied in accordance with the relative rotation angle of the rotational member and said other of said magnetic drum and said magnetic sensor; a plurality of magnetic sensors which are provided in said magnetic sensor unit, wherein in order to correct harmonic distortion of an arbitrary order, said magnetic sensors are spaced at a distance smaller than one pitch of the magnetized portions, so that detection signals of each of said magnetic sensors are offset by a predetermined phase difference; and
   a calculation device for calculating two sets of vectorial signals, from detection-signal output levels of said plurality of magnetic sensors generated upon rotation of said rotational member, using the following equations (1) and (2):

$$A_{out} = \Sigma^{W}_{m=1} Vm \times \sin \theta m \qquad (1); \text{ and}$$

$$B_{out} = \Sigma^{W}_{m=1} Vm \times \cos \theta m \qquad (2); \text{ wherein}$$

W designates the number of said plurality of magnetic sensors;
   Vm designates said detection-signal output levels of said plurality of magnetic sensors generated upon rotation of said rotational member;
   $A_{out}$ designates a set of vectorial signals; and
   $B_{out}$ designates another set of vectorial signals.

2. The magnetic encoder according to claim 1, wherein said calculation device calculates a rotation angle of the rotational member by an interpolation calculation of said two sets of vectorial signals.

3. The magnetic encoder according to claim 1, wherein a rotation angle of the rotational member is determined by an interpolation calculation of said two sets of vectorial signals.

4. The magnetic encoder according to claim 3, wherein said interpolation calculation is performed using $\tan^{-1}(A_{out}/B_{out})$.

5. The magnetic encoder according to claim 3, wherein each of the plurality of magnetic sensors comprises a magnetic reluctance element, wherein the magnetic reluctance elements are provided on a single substrate.

6. The magnetic encoder according to claim 5, wherein the output signals of the magnetic reluctance elements are A/D-converted so as to produce digital signals, so that the interpolation calculation is carried out by the equations (1) and (2) on the digital signals.

7. The magnetic encoder according to claim 6, wherein the A/D-converted digital signals are corrected using a predetermined coefficient.

8. The magnetic encoder according to claim 6, wherein the output signals that have the same coefficient in the equations (1) and (2) are added by an analog process, wherein the added output signals are thereafter A/D-converted.

9. The magnetic encoder according to claim 8, wherein the analog process comprises an electrical connection of corresponding said magnetic reluctance elements in series.

10. A method for reducing harmonic distortion for a magnetic encoder which comprises a magnetic drum which is provided on the outer peripheral surface thereof with a plurality of magnetized portions which are spaced at equal pitches, and a plurality of magnetic sensors which are opposed to the outer peripheral surface of the magnetic drum, wherein output detection signals from said plurality of magnetic sensors are cyclically varied in accordance with the rotation angle of a rotational member comprising one of said magnetic drum and said plurality of magnetic sensors; said method comprising:

arranging said plurality of magnetic sensors so as to be spaced at a distance smaller than one pitch of the magnetized portions, so that detection signals of the respective magnetic reluctance elements are offset by a predetermined phase difference in order to correct harmonic distortion of an arbitrary order;

substituting output levels of the detection signals of said plurality of magnetic sensors, wherein said detection signals are detected when the rotational member rotates, into the following equations (1) and (2):

$$A_{out} = \Sigma^{W}_{m=1} Vm \times \sin\theta m \qquad (1); \text{ and}$$

$$B_{out} = \Sigma^{W}_{m=1} Vm \times \cos\theta m \qquad (2); \text{ wherein}$$

W designates the number of said plurality of magnetic sensors;

Vm designates said detection-signal output levels of said plurality of magnetic sensors generated upon rotation of said rotational member;

$A_{out}$ designates a set of vectorial signals; and $B_{out}$ designates another set of vectorial signals.

* * * * *